(12) United States Patent
Curtis et al.

(10) Patent No.: US 7,074,636 B2
(45) Date of Patent: Jul. 11, 2006

(54) METHODS AND APPARATUS FOR ATTACHING GETTERS TO MEMS DEVICE HOUSINGS

(75) Inventors: Harlan L. Curtis, Champlin, MN (US);
Max C. Glenn, Chanhassen, MN (US);
Jon B. DCamp, Savage, MN (US);
Lori A. Dunaway, New Hope, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/127,388

(22) Filed: May 12, 2005

(65) Prior Publication Data

US 2005/0208739 A1    Sep. 22, 2005

Related U.S. Application Data

(62) Division of application No. 10/393,237, filed on Mar. 20, 2003, now Pat. No. 6,914,323.

(51) Int. Cl.
*H01L 21/00* (2006.01)

(52) U.S. Cl. .......................................... 438/50; 438/51
(58) Field of Classification Search ................ 438/51, 438/124, 126, 50
See application file for complete search history.

(56) References Cited

U.S. PATENT DOCUMENTS 6,534,850 B1 *   3/2003   Liebeskind ................. 257/682

* cited by examiner

*Primary Examiner*—Roy Potter
(74) *Attorney, Agent, or Firm*—Dina Khaled, Esq.; Armstrong Teasdale LLP (57) ABSTRACT

A method for reducing occurrences of loose gettering material particles within micro-electromechanical system (MEMS) devices is described. The MEMS devices include a micro-machine within a substantially sealed cavity formed by a housing and a cover for the housing. The cavity containing a getter mounted on a getter substrate which is to be attached to the cover. The method includes providing an area between a portion of the cover and a portion of the getter substrate, positioning the getter within the area, and attaching the getter substrate to the cover.

24 Claims, 7 Drawing Sheets

METHODS AND APPARATUS FOR ATTACHING GETTERS TO MEMS DEVICE HOUSINGS

CROSS REFERENCE TO RELATED APPLICATIONS

This application is a divisional application of U.S. patent application Ser. No. 10/393,237, filed Mar. 20, 2003 now U.S. Pat. No. 6,914,323, which is hereby incorporated by reference in its entirety.

BACKGROUND OF THE INVENTION

This invention relates generally to manufacturing of Micro Electromechanical System (MEMS) devices, and more specifically to, attaching getter devices to the MEMS devices.

Micro-electromechanical systems (MEMS) integrate electrical and mechanical components on the same substrate, for example, a silicon substrate, using microfabrication technologies. The electrical components are fabricated using integrated circuit processes, while the mechanical components are fabricated using micromachining processes that are compatible with the integrated circuit processes. This combination makes it possible to fabricate an entire system on a chip using standard manufacturing processes.

One common application of MEMS devices is in the design and manufacture of sensor devices. The mechanical portion of the sensor device provides the sensing capability, while the electrical portion of the sensor device processes the information received from the mechanical portion. One example of a MEMS device is a gyroscope.

One part of the MEMS production process involves the packaging of operational portions of the MEMS device within a housing, which is hermetically sealed to provide a preferred operating environment for the MEMS device. Getters are sometimes utilized in the packaging process and attached to the housing, in an attempt to maintain the preferred operating environment for the MEMS device (i.e. removal of water vapor and oxygen, for example).

However, getters can generate particles that can interfere with and be detrimental to operation of the MEMs device. In one example, a MEMS gyroscope and other MEMS based inertial devices can be exposed to high-G forces that may increase an amount of particles that become released from the getter.

BRIEF SUMMARY OF THE INVENTION

A method for reducing occurrences of loose gettering material particles within micro-electromechanical system (MEMS) devices is provided. The MEMS devices include a micro-machine within a substantially sealed cavity formed by a housing and a cover for the housing, and the cavity contains a getter mounted on a getter substrate, the getter substrate to be attached to the cover. The method comprises providing an area between a portion of the cover and a portion of the getter substrate, positioning the getter within the area, and attaching the getter substrate to the cover.

In another aspect, a micro-electromechanical system (MEMS) device is provided which comprises a micro-machine, a housing configured to hold the micro-machine, a cover configured to be attached to the housing, a getter, and a getter substrate, the getter mounted on the getter substrate. The cover and the housing form a substantially sealed cavity, and the cover comprises an underside. The substrate and the cover provide an area between the getter substrate and the cover for locating the getter.

In still another aspect, a micro-electromechanical system (MEMS) gyroscope comprising a housing, a micro-machine, a getter, a getter substrate, and a cover is provided. The micro-machine is coupled to the housing, and at least a portion of the micro-machine comprises at least one sense plate, at least one proof mass suspended above the sense plate, at least one motor drive comb and at least one motor pick-off comb. The getter comprises a gettering material and is mounted on the getter substrate. The cover comprises a bottom surface and a top surface and is attached to the housing which forms a substantially sealed cavity for the micro-machine and the getter. The getter is located between the getter substrate and the cover.

In yet another aspect, a method for mounting a getter within a substantially sealed cavity formed by a housing and a cover configured to attach to the housing is provided. The housing contains a micro-electromechanical system (MEMS) machine and the method comprises forming a recess in the cover and mounting the getter within the recess.

In still yet another aspect, a method for attaching a getter to a cover, where the cover is configured to attach to a housing containing a micro-electromechanical system (MEMS) machine is provided. The method comprises mounting the getter on a getter substrate and attaching the getter substrate to the cover, the getter being between the getter substrate and the cover.

DETAILED DESCRIPTION OF THE INVENTION

Figure 1:
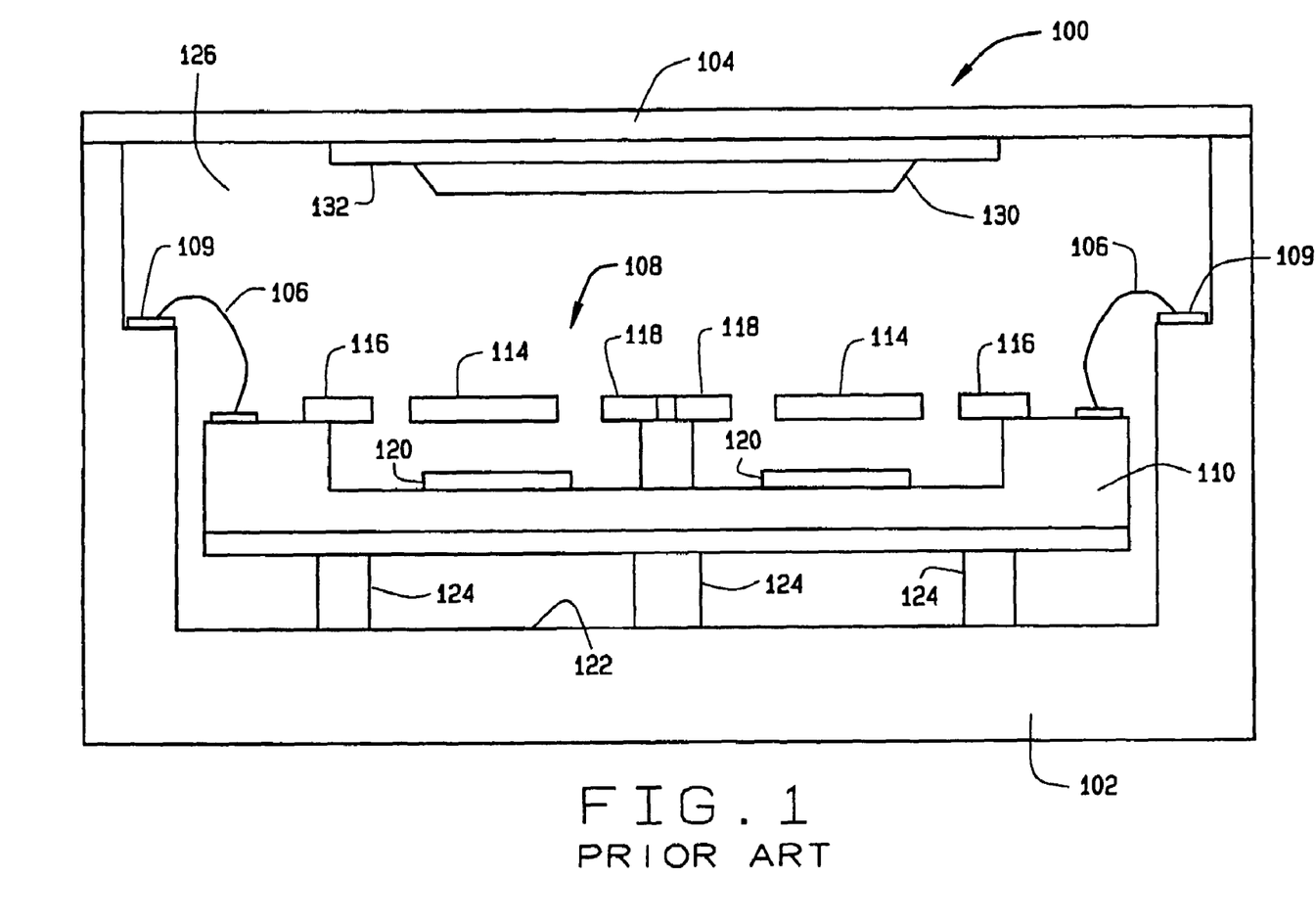
FIG. 1 is a side view of a known MEMS device utilizing a getter.

FIG. 1 is a diagram of one known embodiment of a Micro-Electromechanical System (MEMS) 100. MEMS 100 includes a housing 102 (sometimes referred to as a chip carrier) to which a cover 104 is eventually attached in order to form a sealed cavity. Electrical leads 106 provide electrical connections to a micro-machine 108 which includes a die 110 that is attached to housing 102. As shown in FIG. 1, electrical connections 109 are provided through housing 102 to external devices (not shown). For example, in the case of a MEMS tuning fork gyroscope, micro-machine 108 includes, proof masses 114, motor drive combs 116, and motor pick-off combs 118. Micro-machine 108 further includes sense plates 120 which form parallel plate capacitors with proof masses 114. In one embodiment, sense plates 120 are metal films that have been deposited and patterned onto die 110. Die 110 is attached to a bottom surface 122 of housing 102 utilizing contacts 124. In one embodiment, the attachment of die 110, contacts 124, and housing 102 is accomplished utilizing a thermocompression bonding process.

Upon completion of micro-machine 108, and its attachment to housing 102, cover 104 is attached to housing 102 to form a substantial hermetic seal. In one embodiment, a cavity 126 is formed when cover 104 is attached to housing 102, and cavity 126 may be backfilled with a dry gas, to remove any water vapor within cavity 126. In another embodiment, cover 104 is attached to housing 102 under vacuum conditions, and a vacuum is formed within cavity 126. Cavity 126 allows components of micro-machine 110 an ability to move freely. For example, proof masses 114 may be movably coupled to micro-machine chip 108 and therefore may oscillate within the vacuum of cavity 126.

However, the seal between housing 102 and cover 104 is typically not absolute. In one embodiment, a getter 130 which includes a gettering material (not shown) is attached to a getter substrate 132. Getter substrate 132 is then attached to cover 104. Getter 130 is configured to remove water vapor or other gases (e.g. helium) within cavity 126, as is known in the art. These gases are known to permeate the seal between housing 102 and cover 104 over time and are also known to be emitted over time (into cavity 126) by the materials which make up housing 102 and cover 104. Removal of the water vapor and gases helps to maintain an integrity of the environment of cavity 126, which is at least partially responsible for the operation of micro-machine 110. The gettering material of getter 130 is typically particle based, and as described above, some gettering material may break free from getter 130, and may inhibit an ability of components of micro-machine 110 from moving freely. Such an inhibition is detrimental to the operation of MEMS device 100.

Figure 2:
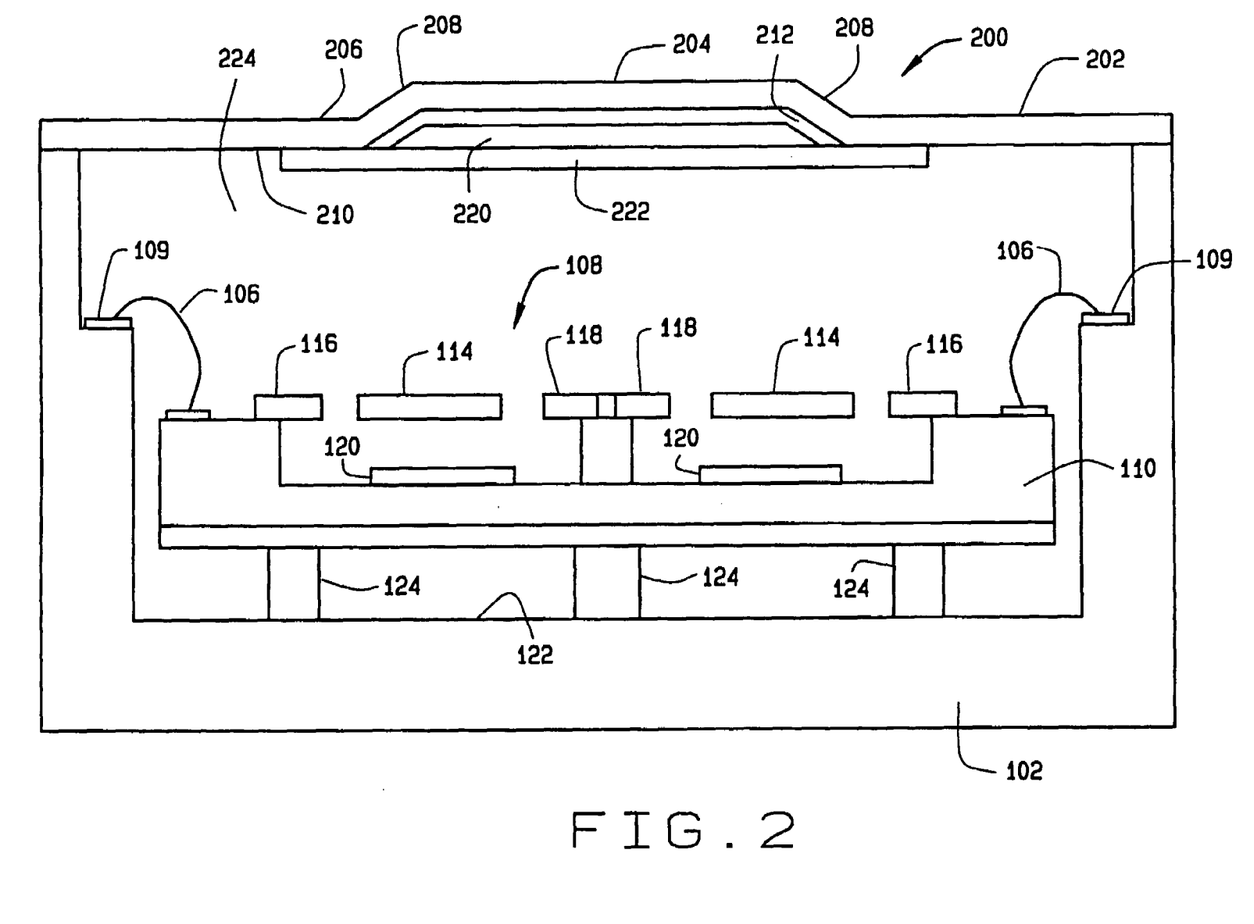
FIG. 2 is a side view of a MEMS device where the getter is reverse mounted, and located within a dimple in the housing cover.

FIG. 2 illustrates a side view of a MEMS device 200 which is configured to alleviate at least some of the problems associated with gettering material breaking free from a getter. Components in FIG. 2 which are the same as those described with respect to FIG. 1, are shown in FIG. 2 and in subsequent Figures utilizing the same reference numerals.

Referring specifically to FIG. 2, MEMS device 200 includes a dimpled cover 202 which is configured to be attached to housing 102 in order to form a vacuum. Dimpled cover 202 includes a raised area 204 and a top surface 206 which are connected by a sloping area 208. A bottom surface 210 of cover 202 includes an indented area 212 formed as an underside of raised area 204. In one embodiment, dimpled cover 202 is formed utilizing one or more of a molding process and a punching process. In one embodiment, a getter 220 which includes a gettering material, is shaped to fit within indented area 212. In the embodiment shown in FIG. 2, getter 220 is mounted on a getter substrate 222. Getter substrate 222 is attached to bottom surface 210 of cover 202, with getter 220 fitting within indented area 212. In one embodiment, getter 220 and getter substrate 222 are similar to getter 130 and getter substrate 132 (both shown in FIG. 1), and attachment of dimpled cover 202 to housing 102 forms a substantially sealed cavity 224.

Figure 3:
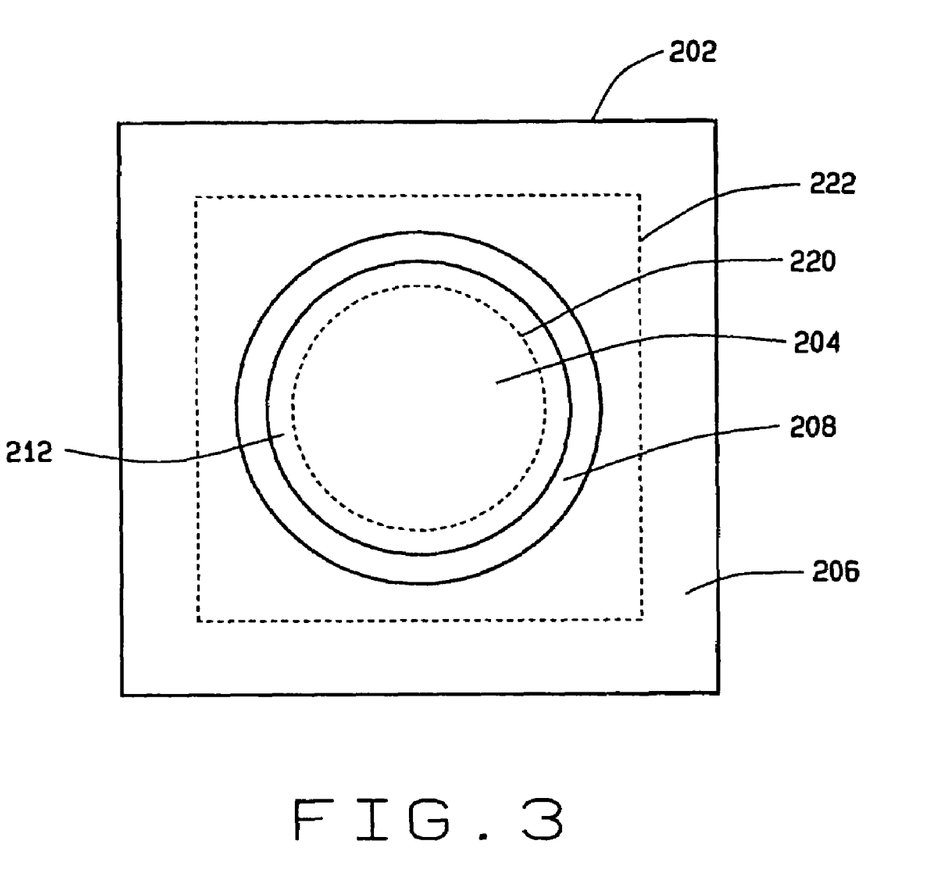
FIG. 3 is a top view of the dimpled housing cover shown in FIG. 2.

FIG. 3 is a top view of dimpled cover 202 which shows raised area 204 and top surface 206 connected by a sloping area 208. FIG. 3 also illustrates one embodiment of a getter 220 that is mounted on a getter substrate 222 and affixed underneath dimpled cover 202. Getter 220 and getter substrate 222 are mounted to dimpled cover 202 in a fashion which allows the gettering material of getter 220 to act on the environment of substantially sealed cavity 224 (shown in FIG. 2). Mounting getter 220 as described effectively contains the gettering material so that individual particles of gettering material do not interfere with the operation of MEMS device 200 (shown in FIG. 2), while continuing to allow gettering to maintain integrity of cavity 224. Formation of indented area 212 provides a recess where getter 220 is mounted, in a reverse orientation, so that getter 220 faces indented area 212. Such a configuration keeps at least a portion of gettering material particles from getting loose within cavity 224 and affecting operation of MEMS device 200.

Figure 4:
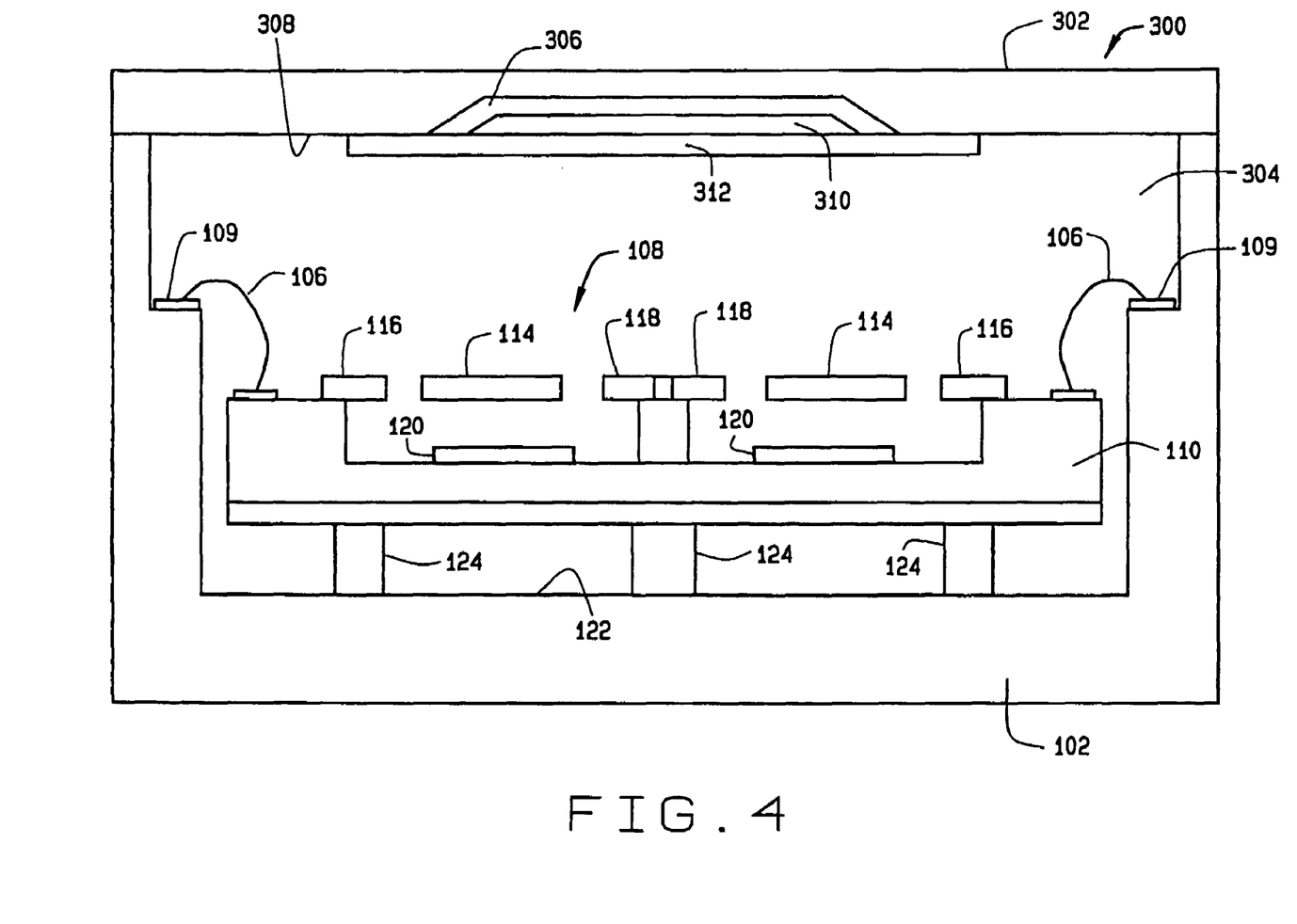
FIG. 4 is a side view of a MEMS device where the reverse mounted getter is located within an indented area of the housing cove, the indented area on a bottom surface of the cover.

FIG. 4 illustrates an alternative embodiment of a MEMS device 300 for reverse mounting a gettering device. Components in FIG. 4 which are the same as those described with respect to FIG. 1, are shown in FIG. 4 utilizing the same reference numerals used in FIG. 1. Referring specifically to FIG. 4, MEMS device 300 includes a machined cover 302 which is configured to be attached to housing 102 as a portion of forming and maintaining a vacuum within cavity 304. Machined cover 302 includes a recess 306 formed in an underside 308 of cover 302. While sometimes referred to as a machined cover, it is contemplated that recess 306 can be formed in cover 302 utilizing one or more of machining and etching processes. In one embodiment, a getter 310 including a gettering material, is shaped to fit within recess 306. In the embodiment shown, getter 310 is mounted on a getter substrate 312. Getter substrate 312 is attached to underside 308 of cover 302, with getter 310 fitting within recess 306. In one embodiment, getter 310 and getter substrate 312 are similar to getter 130 and getter substrate 132 (both shown in FIG. 1), and attachment of cover 302 to housing 102 forms substantially sealed cavity 304.

Similarly to dimpled cover 202 (shown in FIG. 3), machined cover 302 with recess 306 enables one embodiment of getter 310 that is mounted on a getter substrate 312 and affixed underneath cover 302. Getter 310 and getter substrate 312 are mounted to cover 302 in a fashion which allows the gettering material of getter 310 to act on the environment of substantially sealed cavity 304. Mounting getter 310 as described with respect to cover 302 effectively contains the gettering material so that individual particles of gettering material do not interfere with the operation of MEMS device 300, while continuing to allow gettering to maintain integrity of cavity 304. Formation of recess 306 provides an area for placement of getter 310, in a reverse orientation, so that getter 310 faces recess 306. Such a configuration keeps at least a portion of gettering material particles from getting loose within cavity 304 and affecting operation of MEMS device 300.

Figure 5:
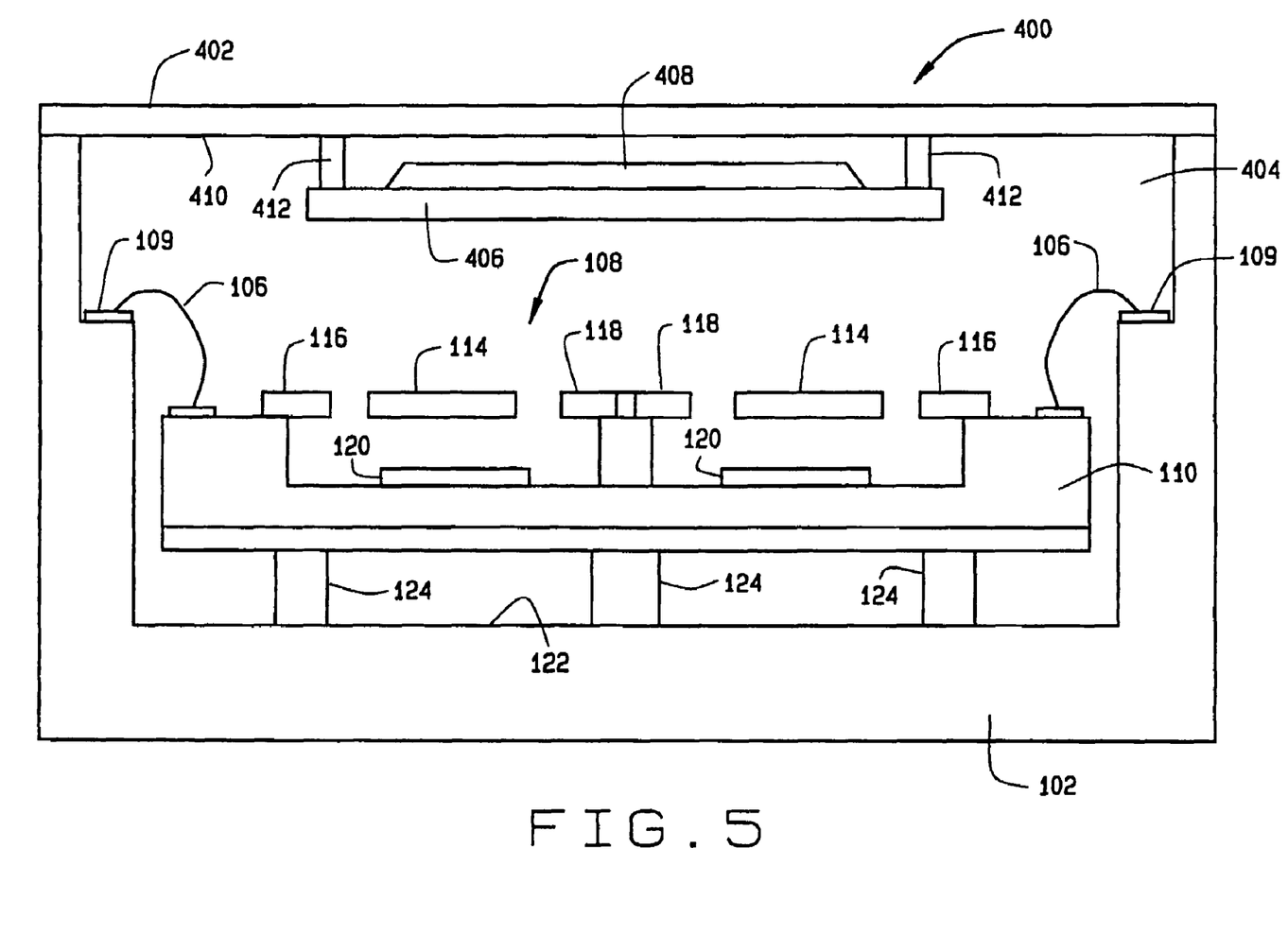
FIG. 5 is a side view of a MEMS device where the getter is reverse mounted by attaching the getter substrate to the housing cover utilizing standoffs.

FIG. 5 illustrates an embodiment of a MEMS device 400 for reverse mounting a gettering device. Components in FIG. 5 which are the same as those described with respect to FIG. 1, are shown in FIG. 5 utilizing the same reference numerals used in FIG. 1. Referring specifically to FIG. 5, MEMS device 400 includes a cover 402 which is configured to be attached to housing 102 as a portion of forming and maintaining a vacuum within cavity 404. A getter substrate 406 has a getter 408, which includes gettering material, mounted thereon. Getter substrate 406 is attached to an underside 410 of cover 402 utilizing a plurality of contacts 412 or standoffs. In one embodiment, contacts 412 are similar to contacts 124 (described with respect to FIG. 1) and getter substrate 406 is attached to cover 402, through contacts 412 utilizing a thermocompression bonding process. In another embodiment, contacts 412 are hollow and utilized as spacers. An attachment device (not shown), for example, a threaded member such as a screw, is used to attach getter substrate 406 to cover 402 through contacts 412. In such an embodiment, the threaded member passes through holes (not shown) in getter substrate 406, through contacts 412, and into a threaded portion (not shown) of cover 402.

Getter 408 and getter substrate 406 are similar to getter 130 and getter substrate 132 (both shown in FIG. 1), and attachment of cover 402 to housing 102 forms substantially sealed cavity 404. Similarly to dimpled cover 202 (shown in FIG. 3), cover 402 and getter substrate 406 mounted to cover 402 with contacts 412, enables one embodiment of getter 408 that is mounted on getter substrate 406 and affixed underneath cover 402. Getter 408 and getter substrate 406 are reverse mounted to cover 402 in a fashion which allows the gettering material of getter 408 to act on the environment of substantially sealed cavity 404. Mounting getter 408 as described with respect to cover 402 effectively contains the gettering material so that individual particles of gettering material do not interfere with the operation of MEMS device 400, while continuing to allow gettering to maintain integrity of cavity 404. Utilization of contacts 412 provides an area for placement of getter 408, in a reverse orientation, so that getter 408 faces cover 402, rather than micro-machine 108. Such a configuration keeps at least a portion of gettering material particles from getting loose within cavity 404 and affecting operation of MEMS device 400.

Figure 6:
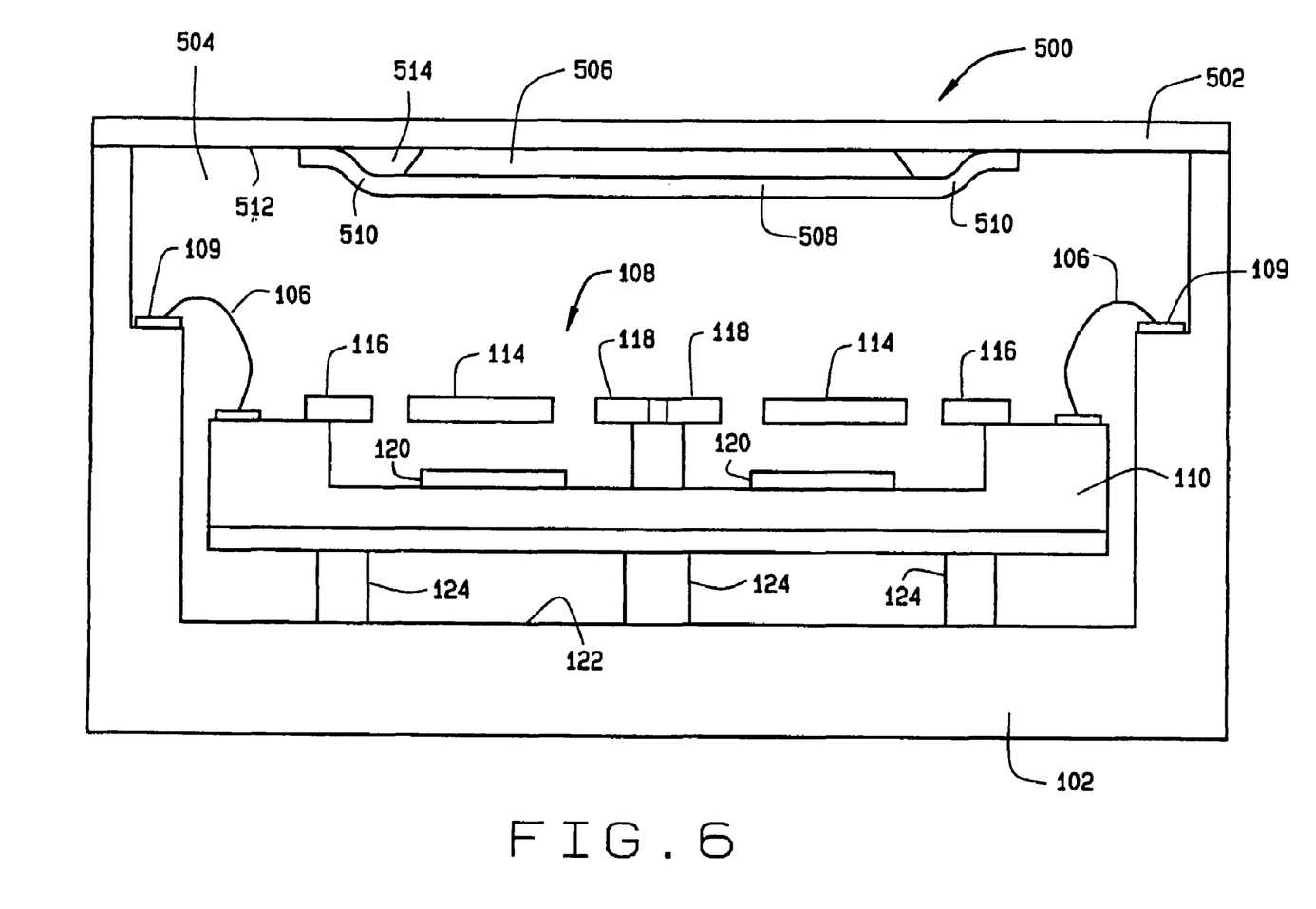
FIG. 6 is a side view of a MEMS device where the getter is reverse mounted by forming the getter substrate to attach to the housing cover, the getter between the substrate and the cover.

FIG. 6 illustrates still another embodiment of a MEMS device 500 for reverse mounting a gettering device. Components in FIG. 6 which are the same as those described with respect to FIG. 1, are shown in FIG. 6 utilizing the same reference numerals used in FIG. 1. Referring specifically to FIG. 6, MEMS device 500 includes a cover 502 which is configured to be attached to housing 102 as a portion of forming and maintaining a vacuum within cavity 504. A getter 506 including a gettering material, is mounted on a getter substrate 508. Getter substrate 508, in one embodiment, is formed with curved portions 510 to allow reverse mounting of getter 506, while still making contact with cover 502. Getter substrate 508 is then bonded to cover 502 utilizing known bonding techniques. In another embodiment, getter substrate 508 is deformed during attachment to cover 502, for example, utilizing pressure provided by an external device (not shown) and resulting in curved portions 510. Getter substrate 508 is attached to an underside 512 of cover 502 as shown, with curved portions 510 of getter substrate 508 forming an area 514 for getter 506. Getter 506 and getter substrate 508 are similar to getter 130 and getter substrate 132 (both shown in FIG. 1), and attachment of cover 502 to housing 102 forms substantially sealed cavity 504.

Similarly to dimpled cover 202 (shown in FIG. 3), cover 502 and getter substrate 508 with curved portions 510 enables an embodiment of getter 506 that is mounted on a getter substrate 508 and affixed underneath cover 502. Getter substrate 508 is mounted to cover 502 in a fashion which allows the gettering material of getter 506 to act on the environment of substantially sealed cavity 504. Mounting getter 506 as described with respect to cover 502 utilizing getter substrate 508 with curved portions 510 effectively contains the gettering material so that individual particles of gettering material do not interfere with the operation of MEMS device 600, while continuing to allow gettering to maintain integrity of cavity 504. Formation of curved portions 510 of getter substrate 508 provides an area 514 for placement of getter 506, in a reverse orientation, so that getter 506 faces cover 502, rather than micro-machine 108. Such a configuration keeps at least a portion of gettering material particles from getting loose within cavity 504 and affecting operation of MEMS device 500.

MEMS devices 100, 200, 300, 400, and 500 may comprise more or fewer components than described. For instance, while two electrical contacts 106 are illustrated, those skilled in the art will recognize that a MEMS device may comprise more than two contacts and/or extruding pins as well. Additionally, more or fewer members may be present in MEMS devices 100, 200, 300, 400, and 500 other than those components above described. Further, components of MEMS devices 100, 200, 300, 400, and 500 may comprise multiple functions. Dimpled cover 202 of MEMS device 200, cover 302 of MEMS device 300, cover 402 of MEMS device 400, and cover 502 of MEMS device 500, may be comprised of a material such as metal, plastic, silicon, glass or a ceramic material. Micro-machine 110 may be any such electromechanical machine used in accordance with MEMS and MEMS based devices. In addition, alternate packages may be used as well to provide a housing for MEMS 100, 200, 300, 400, and 500. The illustrations in the Figures are intended to show multiple embodiments for reverse mounting a getter within a MEMS device rather than provide a description of a specific MEMS device.

Figure 7:
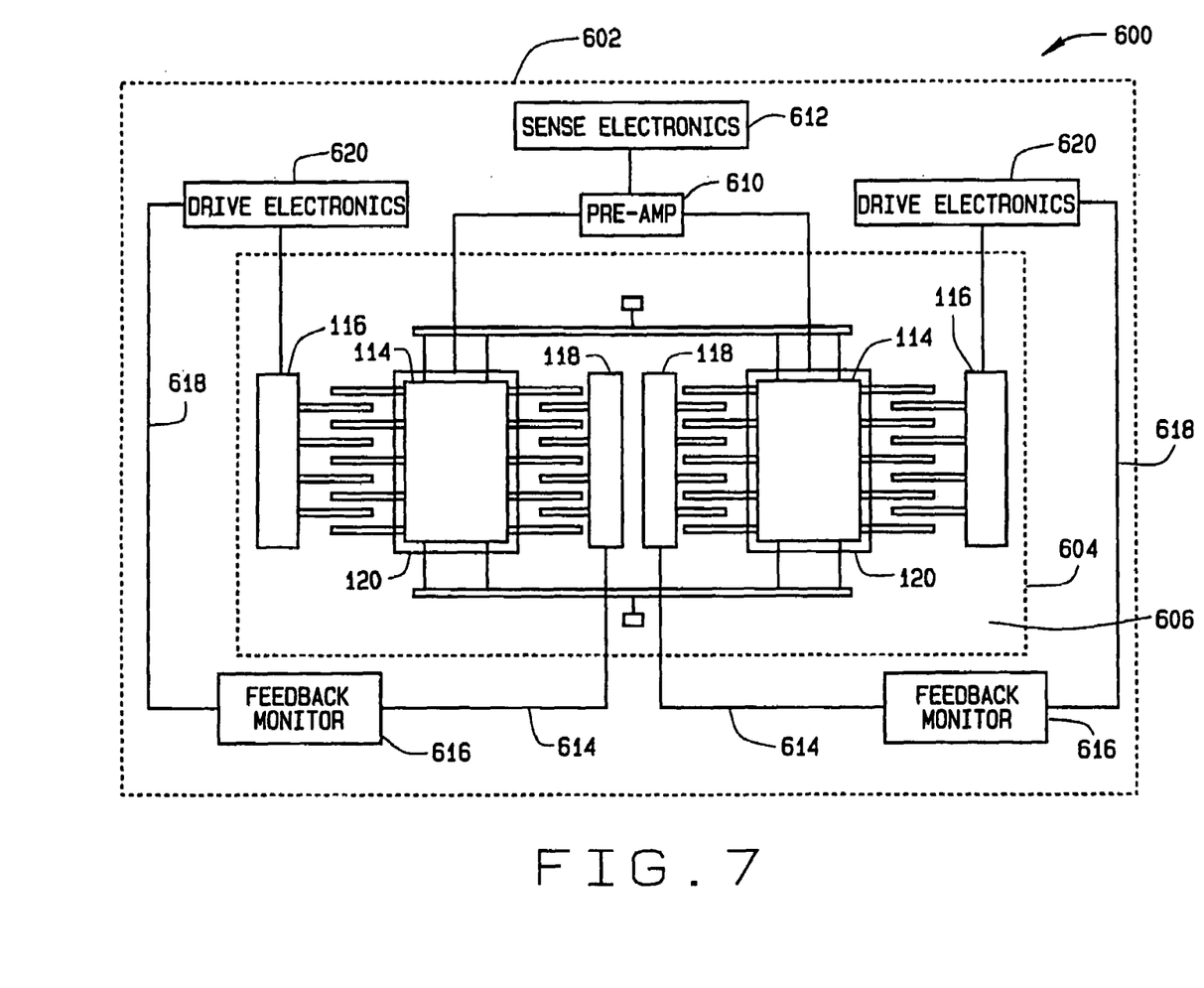
FIG. 7 is a schematic view of a MEMS gyroscope which can be produced utilizing the housing, covers, and getters described with respect to FIGS. 2–6.

FIG. 7 is a schematic illustration of a MEMS gyroscope 600 configured to incorporate any one of dimpled cover 202 (shown in FIG. 2), cover 302 (shown in FIG. 4), cover 402 (shown in FIG. 5), and cover 502 (shown in FIG. 6) in construction of gyroscope 600. In one embodiment, MEMS gyroscope 600 includes a housing 602 (similar to housing 102 (shown in FIGS. 1, 2, 4, 5, and 6) that includes therein a tuning fork gyroscope (TFG) 604. Housing 602 is configured to be sealed with at least one of dimpled cover 202, machined cover 302, cover 402, and cover 502. Housing 602 is typically one of a plastic package, a small outline integrated circuit (SOIC) package, a plastic leaded chip carrier (PLCC) package, a quad flat package (QFP), or other housings as known in the art. Housing 602 provides a structure to co-locate elements of TFG 604 and/or locate other elements within a close proximity of one another within the housing 602. TFG 604, in one embodiment, is located within a substantially sealed cavity 606 which is formed by bonding one of covers 202, 302, 402 and 502 to housing 602.

In one embodiment, TFG 604 includes proof masses 114, motor drive combs 116, motor pick-off combs 118, and sense plates 120 constructed from a wafer. A pre-amplifier 610 is included within housing 602 and is electrically connected or coupled to each proof mass 114 and sense plate 120 combination. In one embodiment, pre-amplifier 610 and TFG 604 are formed on a common substrate and, in one embodiment, are electrically connected. In other embodiments, pre-amplifier 610 is electrically connected to proof masses 114. An output of pre-amplifier 610 is sent to sense electronics 612, or alternatively, pre-amplifier 610 is incorporated within sense electronics 612.

In addition, an output 614 of motor pick-off combs 118 is transferred to feedback monitors 616. Feedback monitors 616 provide output signals 618 to drive electronics 620, which power motor drive combs 116. Alternatively, feedback monitors 616 are incorporated within drive electronics 620. MEMS gyroscope 600 also includes a system power source and other operational electronics, which are not shown in FIG. 7 for ease of illustration.

Motor drive combs 116 excite the proof masses 114 using electrostatic forces by applying a voltage to electrodes of proof masses 114. Motor pick-off combs 118 monitor the excitation or oscillation of proof masses 114 by monitoring voltage signals on electrodes on proof masses 114. Motor pick-off combs 118 output a feedback signal to feedback monitors 616. Feedback monitor 616 provides an output 618 which is input to drive electronics 620. If proof masses 114 begin to oscillate too fast or too slow, drive electronics 620 may adjust an oscillation frequency such that proof masses 114 vibrate at a resonant frequency. Excitation at such a frequency may enable a higher amplitude output signal to be generated.

While operation of gyroscope 600 is described above, such operation is jeopardized if particles of gettering materials, for example, as described above, are loose within cavity 606. As described, such presence of loose gettering materials, at least in some cases, is severe enough to affect operation of gyroscope 600, which is undesirable. Utilization of cover 202 (shown in FIG. 2), cover 302 (shown in FIG. 4), cover 402 (shown in FIG. 5), and cover 502 (shown in FIG. 6) with a reverse orientation getter 220, 310, 408, and 506 respectively, provides the advantages of gettering to maintain integrity of substantially sealed cavity 606, with a much lower probability that gettering material particles become loose within cavity 606. Such covers and reverse orientation getters are further usable in other sensor based-devices which are mentioned above. It is contemplated that the reverse getter orientation method described herein will find utilization in a variety of MEMS devices, including, but not limited to, MEMS inertial measurement units, gyroscopes, pressure sensors, temperature sensors, resonators, air flow sensors, and accelerometers.

While the invention has been described in terms of various specific embodiments, those skilled in the art will recognize that the invention can be practiced with modification within the spirit and scope of the claims.

What is claimed is:

1. A method for reducing occurrences of loose gettering material particles within micro-electromechanical system (MEMS) devices, the device including a micro-machine within a substantially sealed cavity formed by a housing and a cover for the housing, the cavity containing a getter mounted on a getter substrate, the getter substrate to be attached to the cover, said method comprising:
   providing an area between a portion of the cover and a portion of the getter substrate;
   positioning the getter within the area; and
   attaching the getter substrate to the cover.

2. A method according to claim 1 wherein providing an area comprises forming a recess in the cover.

3. A method according to claim 2 wherein forming a recess in the cover further comprises shaping the recess such that the getter fits within the recess.

4. A method according to claim 2 wherein forming a recess in the cover comprises forming an indented area in a bottom surface of the cover.

5. A method according to claim 2 wherein forming a recess in the cover comprises at least one of molding or punching an indented area in a bottom surface of the cover.

6. A method according to claim 2 wherein forming a recess in the cover comprises at least one of machining and etching a recess into an underside of the cover.

7. A method according to claim 1 wherein attaching the getter substrate to the cover comprises attaching the getter substrate to the cover in a fashion that allows access to the getter.

8. A method according to claim 1 wherein:
   providing an area comprises positioning contacts between the getter substrate and the cover; and
   attaching the getter substrate to the cover comprises attaching the getter substrate to the cover utilizing the contacts.

9. A method according to claim 1 wherein providing an area comprises forming curved portions in the getter substrate.

10. A method for mounting a getter within a substantially sealed cavity formed by a housing and a cover configured to attach to the housing, the housing containing a micro-electromechanical system (MEMS) machine, said method comprising:
    forming a recess in the cover; and
    mounting the getter within the recess.

11. A method according to claim 10 further comprising attaching a substrate to the cover, the substrate configured to reduce occurrences of particles of gettering material from the getter from contacting the MEMS machine.

12. A method according to claim 10 wherein forming a recess in the cover comprises one of molding the cover with the recess, punching the recess into the cover, etching the recess into the cover, and machining the recess into the cover.

13. A method according to claim 10 wherein mounting the getter within the recess comprises:
    attaching the getter to a getter substrate; and
    attaching the getter substrate to the cover such that the getter is located within the recess.

14. A method according to claim 13 wherein attaching the getter substrate to the cover comprises ensuring that the getter is exposed to the cavity.

15. A method for attaching a getter to a cover, the cover configured to attach to a housing containing a micro-electromechanical system (MEMS) machine, said method comprising:
    mounting the getter on a getter substrate; and
    attaching the getter substrate to the cover, the getter being at least partially between the getter substrate and the cover.

16. A method for mounting a getter for a micro-electromechanical system (MEMS) machine, said method comprising:
    providing a housing with a plurality of surfaces within;
    attaching the getter to a getter substrate;
    configuring one of the surfaces to provide an area between the getter substrate and the surface for at least a portion of the getter; and
    attaching the getter substrate to the configured surface.

17. A method according to claim 16 wherein configuring one of the surfaces to provide an area comprises forming an indented area in the surface to provide the area between the getter substrate and the surface.

18. A method according to claim 17 wherein forming an indented area in the surface comprises forming at least one of a machined recess, an etched recess, a molded area, and a punched indentation in the surface.

19. A method according to claim 16 wherein attaching the getter substrate to the configured surface comprises utilizing a plurality of contacts to attach the getter substrate to the surface, the contacts providing the area between the getter substrate and the surface.

20. A method according to claim 16 further comprising configuring the getter substrate with curved portions, the curved portions providing the area between the getter substrate and the surface and allowing the getter substrate to be attached to the surface.

21. A method for attaching a getter to a housing configured to provide a substantially sealed cavity for a microelectromechanical system (MEMS) machine, said method comprising:
  mounting the getter on a getter substrate; and
  attaching the getter substrate to a surface within the housing, the getter being at least partially between the getter substrate and the housing.

22. A method according to claim 21 further comprising configuring at least one of the surfaces of the housing with an indented area to provide the area between the getter substrate and the surface.

23. A method according to claim 21 further comprising configuring the getter substrate with an indented area to provide the area between the getter substrate and the surface of the housing.

24. A method according to claim 21 further comprising configuring the getter substrate with curved portions, the curved portions providing at least a portion of the indented area between the getter substrate and the surface of the housing.

* * * * *